(12) United States Patent
Sewell

(10) Patent No.: US 6,611,316 B2
(45) Date of Patent: Aug. 26, 2003

(54) METHOD AND SYSTEM FOR DUAL RETICLE IMAGE EXPOSURE

(75) Inventor: Harry Sewell, Ridgefield, CT (US)

(73) Assignee: ASML Holding N.V., Wilton, CT (US)

( * ) Notice: Subject to any disclaimer, the term of this patent is extended or adjusted under 35 U.S.C. 154(b) by 0 days.

(21) Appl. No.: 10/083,667

(22) Filed: Feb. 27, 2002

(65) Prior Publication Data

US 2002/0123012 A1 Sep. 5, 2002

Related U.S. Application Data

(60) Provisional application No. 60/271,380, filed on Feb. 27, 2001.

(51) Int. Cl.$^7$ ................................................ G03B 27/44
(52) U.S. Cl. ............................................. 355/46; 355/53
(58) Field of Search .............................. 355/46, 52, 66, 355/53

(56) References Cited

U.S. PATENT DOCUMENTS

| | | | | |
|---|---|---|---|---|
| 5,841,520 A | * | 11/1998 | Taniguchi | 25/201.1 |
| 6,057,065 A | * | 5/2000 | Rolson | 355/53 |
| 6,153,357 A | * | 11/2000 | Okamoto et al. | 250/492.2 |
| 6,351,304 B1 | * | 2/2002 | Kawashima et al. | 250/492.2 |

OTHER PUBLICATIONS

Sewell, H., Abstract: "A New Dimension in Phase Shift Mask Technology," submitted to a 1993 International Society for Optical Engineering (SPIE) Conferernce, abstract published, paper never published, 1 page (1993).

Sewell, H., Presentation: "A New Dimension in Phase–Shift Mask Technology," presented at a 1993 International Society for Optical Engineering (SPIE) Conference, 23 pages (1993).

* cited by examiner

Primary Examiner—Russell Adams
Assistant Examiner—D. Ben Esplin
(74) Attorney, Agent, or Firm—Sterne, Kessler, Goldstein & Fox PLLC

(57) ABSTRACT

The present invention provides a method and system for simultaneously imaging at least two reticles onto a substrate. According to the present invention, the wafer is passed through the exposure sequence once with images from the reticles being exposed simultaneously onto the wafer. The throughput of the system is effectively maintained at the standard single pass throughput level or twice that of conventional systems. In one embodiment, the present invention produces two reticle images side-by-side in the exit pupil of the optics of a step and scan wafer exposure system. The scanning action of the exposure tool then effectively superimposes the two images during the exposure of the wafer. Each image exposes the photoresist as the wafer is scanned through the image field synchronously with the scanning of the reticles. According to one embodiment, the image scanning is synchronized so that two required images are superimposed. According to another embodiment, the two images can be independently focused and aligned.

14 Claims, 11 Drawing Sheets

METHOD AND SYSTEM FOR DUAL RETICLE IMAGE EXPOSURE

CROSS-REFERENCE TO RELATED APPLICATIONS

This application claims the benefit of U.S. Provisional Application No. 60/271,380, "Method and System for Dual Reticle Image Exposure," filed Feb. 27, 2001, which is incorporated by reference herein in its entirety.

BACKGROUND OF THE INVENTION

1. Field of the Invention

The present invention pertains to photolithography.

2. Background Art

There are various photolithographic or microlithographic techniques used in the manufacture of very fine patterns in metals, insulators and semiconductors (i.e., devices). In the photolithographic or microlithographic process, a pattern (e.g., a circuit pattern) contained on a reticle is projected (i.e., imaged) onto a wafer. A wafer is typically a photoresistive substrate that is further processed to form a device or devices.

As feature size requirements continue to shrink, the use of phase-shifting reticles has increased. Phase-shifting reticles increase the effective resolution of a lithographic system. The use of phase-shift techniques typically requires the exposure of the same field or area on a wafer first with a phase-shift reticle and then with a trim reticle. The trim reticle can differ from the phase-shift reticle depending on the implementation.

Techniques such as this two-step imaging can create alignment problems. They also can reduce overall wafer throughput of the system (i.e., the system is slowed because each wafer needs to be exposed twice). As each reticle is set for exposure on a given wafer, the precision alignment process consumes additional time and often reduces the efficiency and yield of the system.

What is needed is a method and system for exposing the same field with at least two different reticles simultaneously. Furthermore, what is needed is a method and system for exposing the same field with at least two different reticles simultaneously such that alignment and calibration problems can be prevented.

BRIEF SUMMARY OF THE INVENTION

The present invention provides a method and system that meet the above-stated needs. The method and system of the present invention produce two reticle images side-by-side in the exit pupil of the projection optics of an exposure and/or reduction system.

In one embodiment, the exposure system is a step-and-scan wafer exposure system. In such an embodiment, the scanning action of the exposure tool effectively superimposes the two images during the exposure of the wafer. Thus, each image exposes the photoresist as the wafer is scanned through the image field in a synchronous manner with the scanning of the reticles. In other words, the image scanning is synchronized so that the two required reticle images are superimposed. In an additional embodiment of the present invention, the system can create the two images to be independently focused and finely aligned.

In one embodiment of the present invention, the system projects two images of illuminated slits from two separate reticles mounted on a scanning stage.

In an alternative embodiment, the system projects two images of illuminated slits from two separate locations on a single reticle mounted on a scanning stage.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1A:
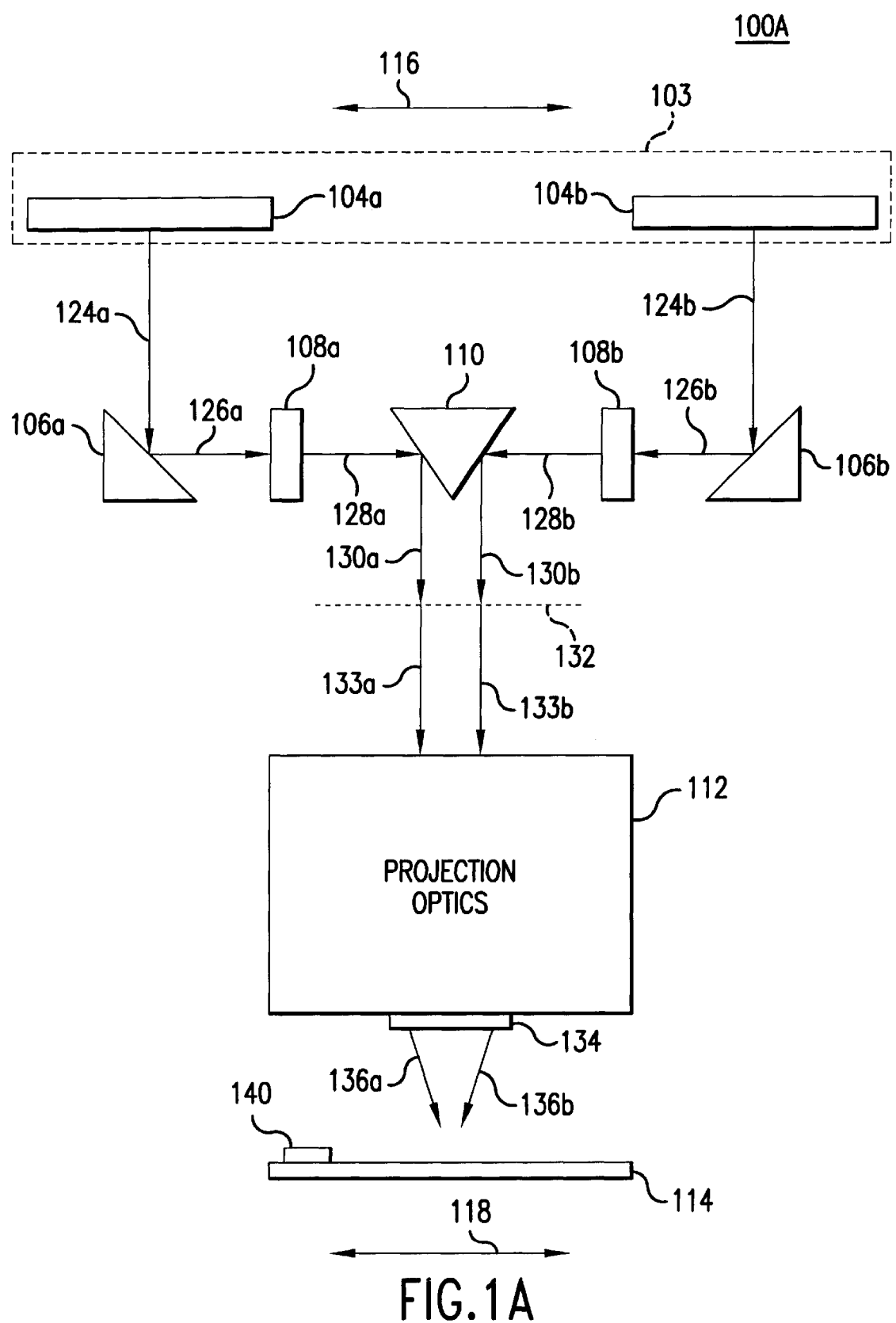
FIG. 1A shows a block diagram of the exposure system using optical relays, according to an embodiment of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the present invention would be of significant utility.

Simultaneous Dual Reticle Exposure

The present invention is directed to a scanning stage and method for increasing the throughput and alignment of a lithographic tool (referred to herein as the system). In an embodiment, the scanning stage includes at least two reticles or a single reticle having two image patterns formed thereon. Hereafter, the at least two reticle or two image approaches will be referred to as the dual reticles to simplify the description of the invention, but not limit its scope of equivalents. According to embodiments of the present invention, the scanning stage has a range of motion that permits similar sections of dual reticles to be scanned simultaneously. The scanning stage exposes the field with the patterns from each of the dual reticles.

In one embodiment of the present invention, the lithographic tool is a step and scan system. In another embodiment of the present invention, the lithographic tool is a modified step and repeat system, which may not include the scanning steps. In an alternative embodiment, the lithographic tool is a modified refractive step and scan system.

In embodiments of the present invention, the projection optics can be refractive, reflective or catadioptic.

As one skilled in the relevant art would recognize, based at least on the teachings herein, the configuration of any projection optics system for use depends on the application to which it is engaged. In terms of the present invention, the embodiments described herein employ the catadioptic projection optic system. This is not intended to limit the application of the present invention to catadioptic projection optic systems. One skilled in the relevant art, after reviewing the embodiments disclosed herein, would be able to configure various other types of projection optics systems to perform the present invention.

FIG. 1A shows a block diagram of the exposure system, according to one embodiment of the present invention. System 100 includes a scanning stage 103 capable of scanning along range 116. Scanning stage 103 includes dual reticles, 104a and 104b, respectively. System 100 also includes an optical component 106a, and a second optical component 106b. Optical components 106a and 106b provide focusing, alignment, and offset adjustment features. In one embodiment of the present invention, optical components 106a and 106b can be fold mirrors.

First optical relay 108a and second optical relay 108b are also included in system 100 to optically couple each of the optical components 106 to a central prism 110. In one embodiment of the present invention, the central prism 110 can be a mirror shaped to take the incident beams 128a and 128b and align them with projection optics 112 as indicated by beams 133a and 133b. In alternative embodiments, the central prism 110 can be a beam-splitter or a beam-combiner. In further embodiments, central prism 110 can include phase-shifting properties in at least one side and/or surface.

According to the present invention, a wafer (not shown, but positioned on a substrate stage 114, described below) is passed through the exposure sequence once with images from the reticles 104a and 104b being exposed simultaneously onto the wafer. The throughput of the system is effectively maintained at the standard single pass throughput level, which results in a throughput of twice that of conventional systems. In one embodiment, the present invention produces two images side-by-side in the exit pupil of the optics of a step and scan system. The scanning action of the exposure tool then effectively superimposes the two images during the exposure of the wafer. Each image exposes the photoresist of the wafer as it is scanned through the image field (i.e., the surface area of the wafer being scanned) synchronously with the scanning of the reticles. According to one embodiment, the image scanning is synchronized so that two required images are superimposed.

According to another embodiment, the two images can be independently focused and aligned. Furthermore, according to another embodiment, the illumination conditions of the two images can be independently set and controlled. For example, the components 104a, 106a, and 108a can be aligned and focused, as well as controlled (i.e., scanned) independently of components 104b, 106b, and 108b such that the resulting images can be determined with greater precision.

In one embodiment, as shown in FIG. 1A, the lithographic system 100 includes a scanning stage 103. The scanning stage 103 is adapted to control dual reticles, 104a and 104b, respectively. Furthermore, the scanning stage 103 has a range of motion 116 that permits scanning of the dual reticles simultaneously. The system 100 also includes projection optics 112 positioned to simultaneously project dual images 136a and 136b of at least a portion of each of the dual reticles 104a and 104b. The system 100 also includes a substrate stage 114 positioned to receive at least two images 136a and 136b simultaneously projected from the projection optics 112 at the exit pupil 134. In one embodiment, the scanning stage is capable of positioning at least two images of at least a portion of each of the dual reticles to expose a field on the substrate stage.

As shown in FIG. 1A, reticle 104a is optically aligned with optical component 106a which is optically aligned with optical relay 108a, which, in turn, is optically aligned with central prism 110. Similarly for the respective elements 104b, 106b, and 108b. It is noted that each of the optical components of the system 100 of the present invention can be aligned separately or jointly.

An intermediate image plane 132 is defined between the central prism 110 and a projection optics 112. In alternate embodiments (not shown), there are other positions for the intermediate image plane 132 that exist between 108 and 110, and on both sides of 108 and/or 110. The intermediate image plane 132 provides a reference for alignment, focusing, and offset calculations of the system 100. An exit pupil 134 of the system 100 allows for the passage of energy to a substrate stage 114. Substrate stage 114 is capable of containing one or more wafers and is capable of scanning along range of motion 118.

The reticles 104a and 104b are each exposed by a source of illumination. In a preferred embodiment, the illumination source impinges each reticle having an aperture in the shape of a "slit." The production of the illumination slits is outside the scope of the present invention. The illumination of the slits from the reticles 104a and 104b of the system 100 provide images 124a and 124b, respectively. The dual reticle images are incident upon each of the elements of the system 100, as previously described. The images are passed by each element of system 100 as indicated in FIG. 1A. Light ray or beam 124a travels from reticle 104a to optical component 106a. At optical component 106a, beam 124a is realigned as beam 126a to optical relay 108a. Optical relay 108a is aligned to pass beam 126a as beam 128a to prism 110. The similar beam path is followed for beams 124b, 126b, and 128b.

According to one embodiment of the present invention, the system 100 processes the images of beams 124a and 124b produced from the separate dual reticles 104a and 104b mounted on the scanning stage 103. In an alternative embodiment, the at least two images are produced from at least two separate patterns on the same reticle.

In one embodiment, the fine alignment and positioning of the images of beams 124a and 124b are accomplished using an auto-calibration field detector 140 on the substrate stage 114 end of the system. In such an embodiment, the alignments of the images are monitored using alignment marks on the dual reticles 104a and 104b.

Figure 1B:
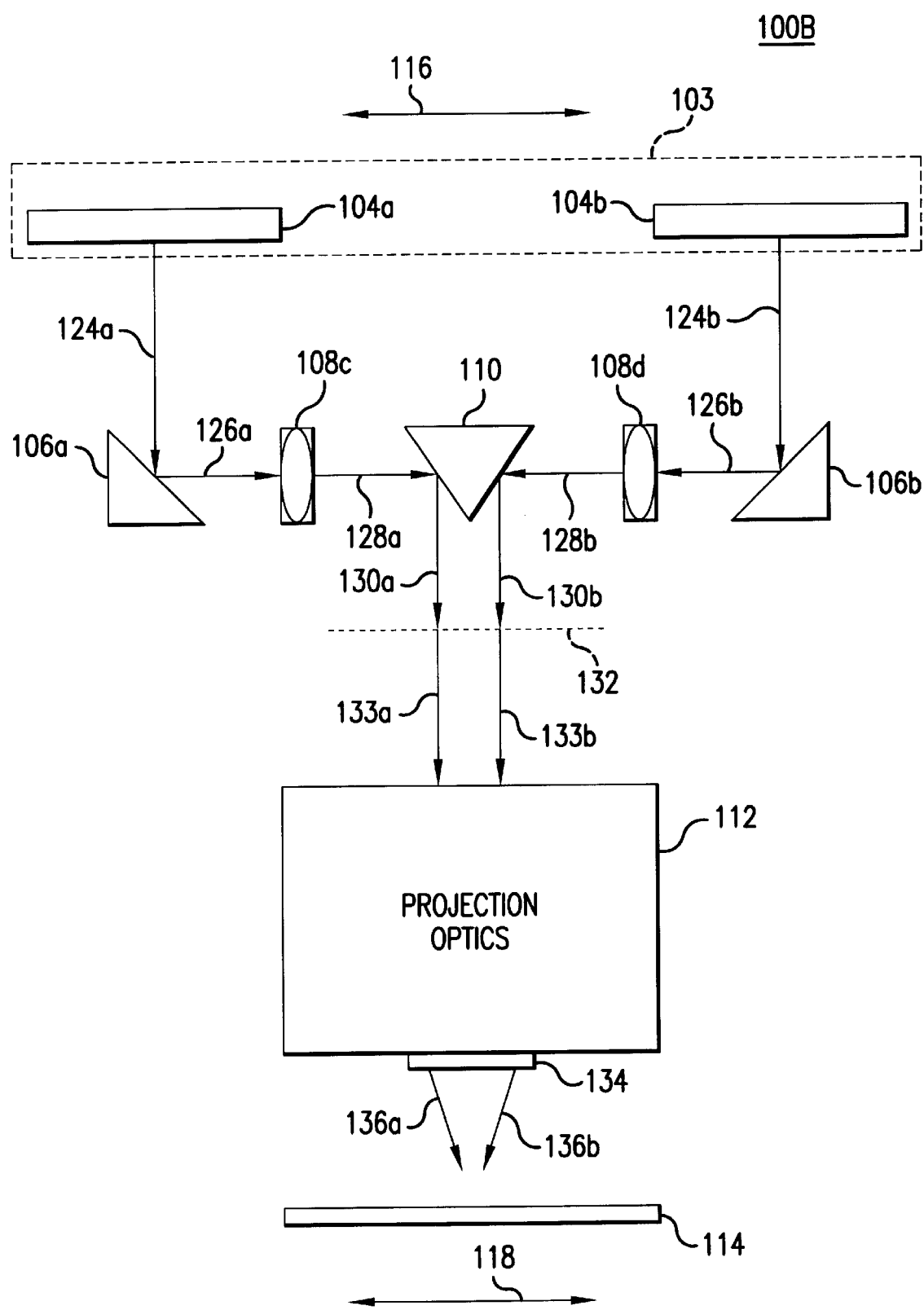
FIG. 1B shows a block diagram of the exposure system using pupil filters, according to an embodiment of the present invention.

FIG. 1B shows a block diagram of the exposure system using pupil filters, according to an embodiment of the present invention. In FIG. 1B, first optical relay 108a and second optical relay 108b are replaced with first pupil filter 108c and second pupil filter 108d, respectively and as indicated in FIG. 1B. According to an embodiment, pupil filters 108c and 108d can be contractile apertures for conditioning the incident beams. For example, the pupil filters can alter the focus and intensity of the incident beams. The pupil filters are used to independently condition each channel of incident beams, such as beams 126a and 126b.

Figure 1C:
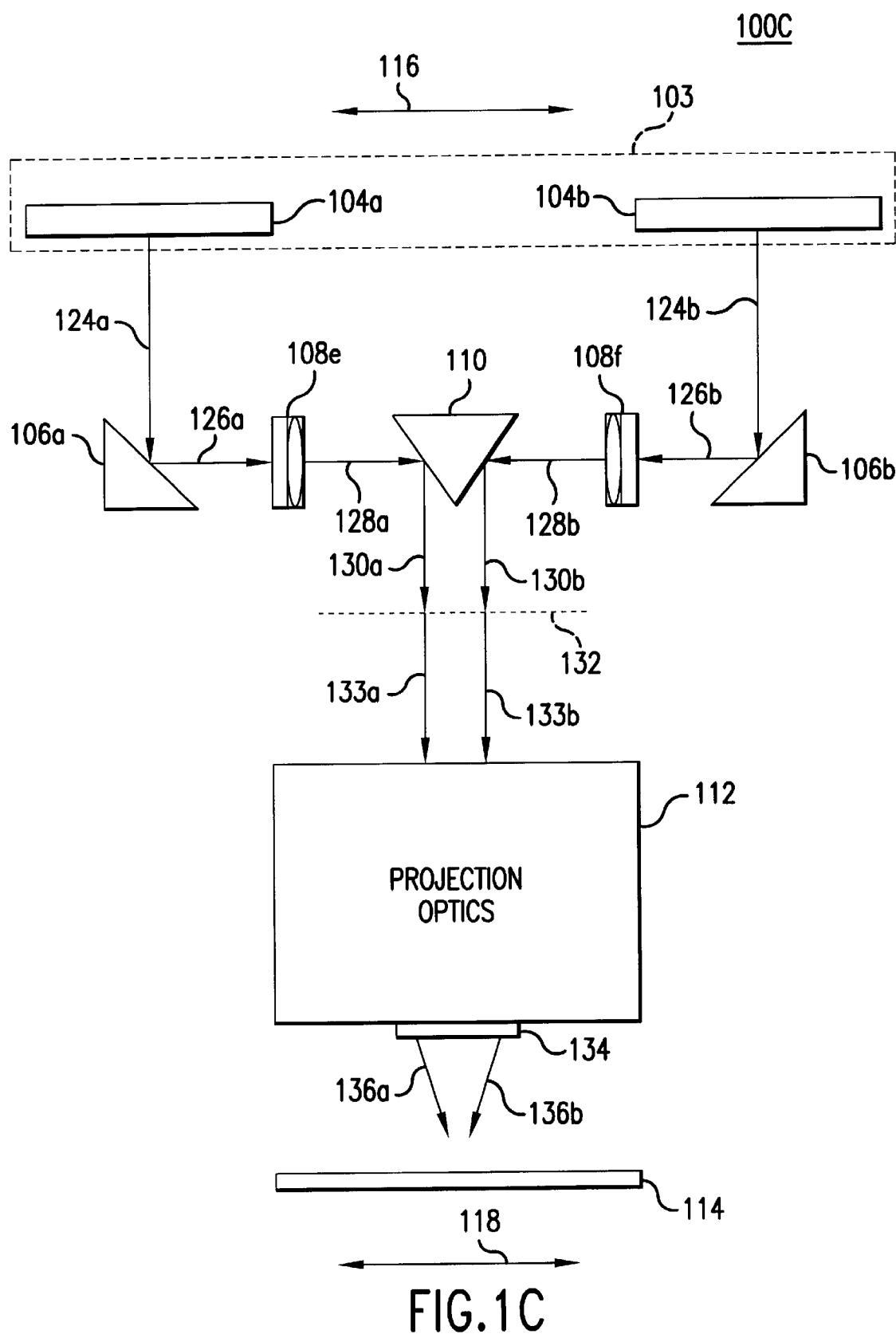
FIG. 1C shows a block diagram of the exposure system using both pupil filters and optical relays, according to an embodiment of the present invention.

FIG. 1C shows a block diagram of the exposure system using both pupil filters and optical relays, according to an embodiment of the present invention.

In FIG. 1C, first combined component 108e and second combined component 108f replace the optical relays 108a and 108b of FIG. 1A. In an embodiment, the components 108e and 108f include the functionality of both the optical relay (e.g., 108a) and the pupil filter (e.g., 108c).

Figure 1D:
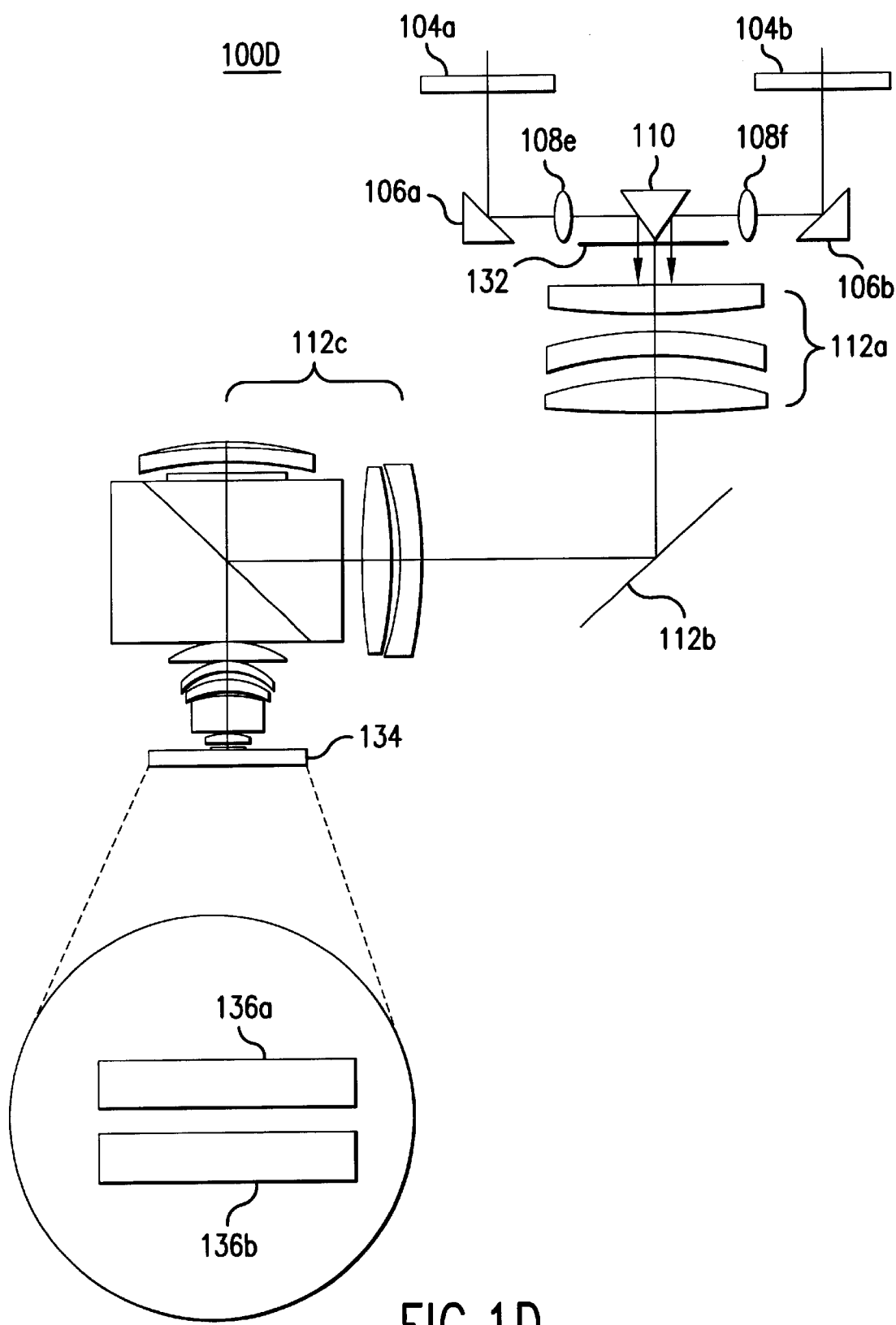
FIG. 1D shows a block diagram of the exposure system using both pupil filters and optical relays, according to another embodiment of the present invention.

FIG. 1D shows a block diagram of the exposure system using both pupil filters and optical relays, according to another embodiment of the present invention. In FIG. 1D, the exposure system of FIG. 1C is illustrated with additional detail to the projection optics and exit image plane. Referring to FIG. 1D, the projection optics 112 includes a first optical block 112a that provides beam conditioning and initial reduction to mirror component 112b. Mirror component 112b provides the beam to optical block 112c, where block 112c provides the final reduction of the beam to the exit plane 134. The exit plane 134 is further described with regard to FIGS. 2 and 3.

Figure 2:
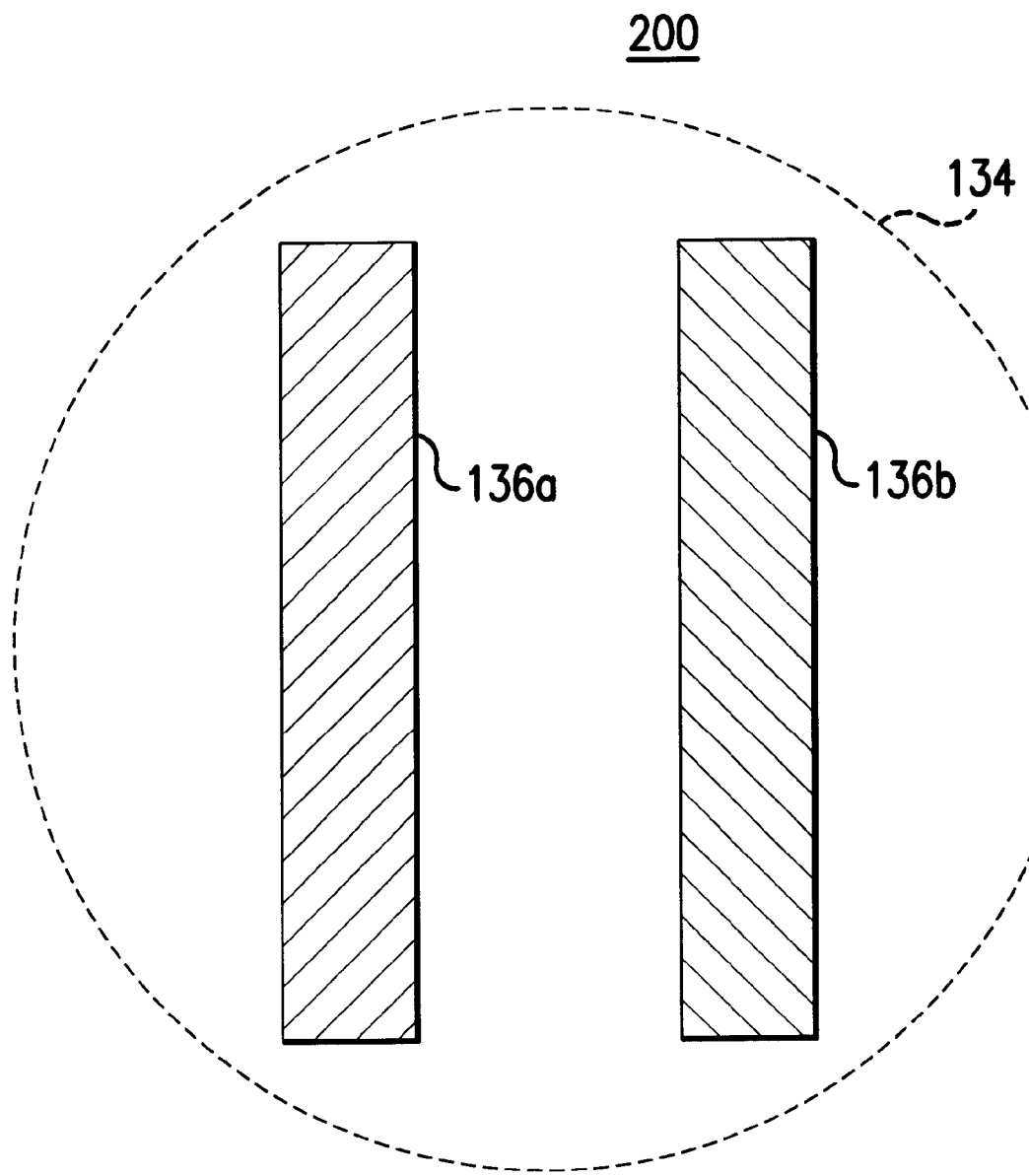
FIG. 2 shows a block diagram of the exit pupil of the projection optics, according to one embodiment of the present invention.

FIG. 2 shows a block diagram of the pattern matching process, according to one embodiment of the present invention. In one embodiment, the optics at exit pupil 134 produce side-by-side images 136a and 136b, respectively, of the illuminated areas of both reticle images. According to these embodiments, the scanning action of the step and scan system results in the superimposition of the dual reticle images in the image field of the substrate stage 114.

Figure 3:
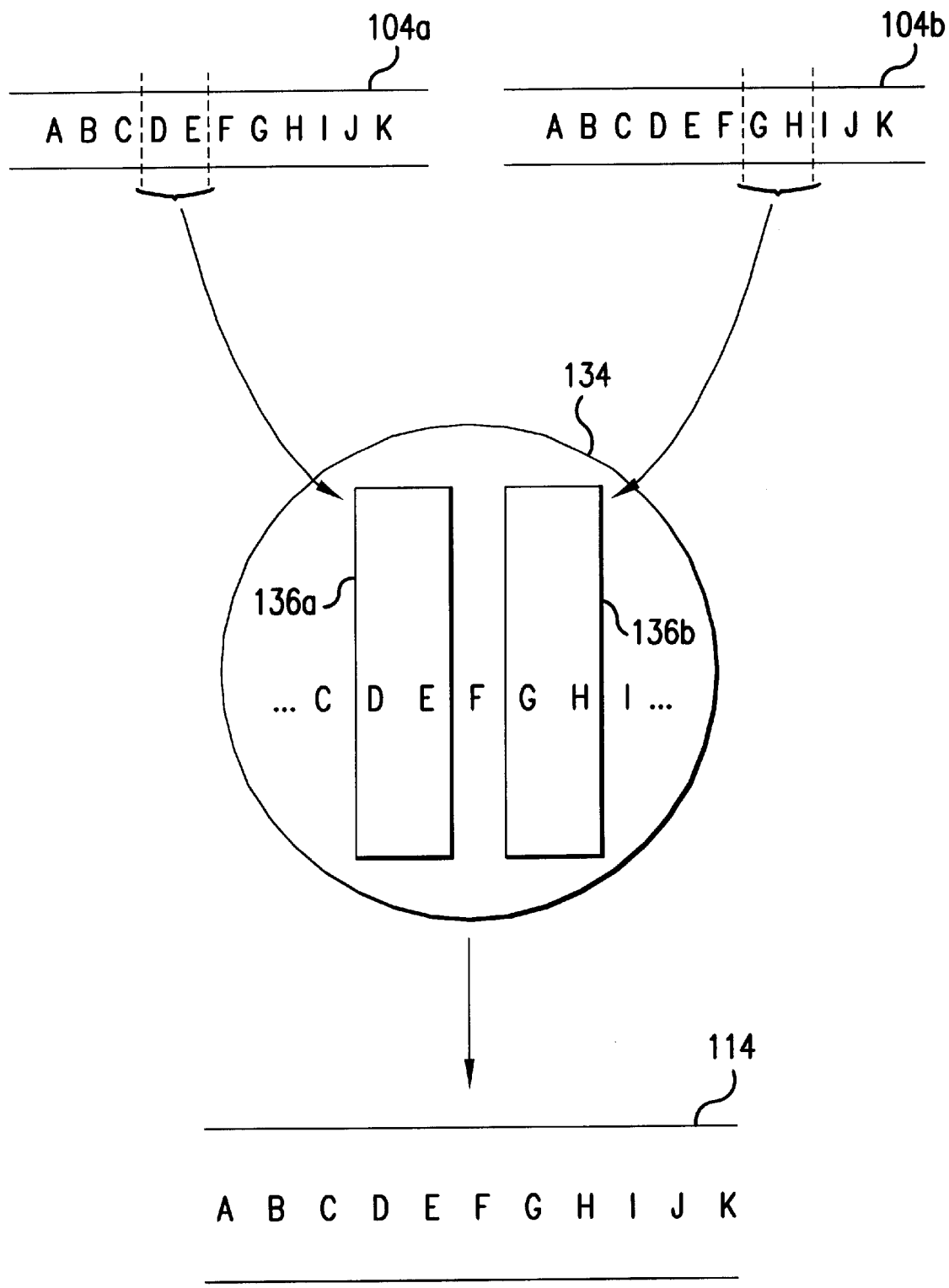
FIG. 3 shows a block diagram of the pattern matching process, according to one embodiment of the present invention.

As shown in FIG. 3, a block diagram of the exit pupil of the projection optics, according to one embodiment of the present invention, is shown. For pattern matching purposes between the two reticles, there is an offset between the illuminated positions on the dual reticles to allow for the position displacement of the images in the exit pupil. Reticle 104a and reticle 104b have patterns as shown in FIG. 3 as "ABCDEFGHIJK". This pattern is for illustrative purposes. These patterns are visible at the exit pupil 134 and indicate the superimposition of the patterns on the substrate stage 114.

In one embodiment, the two reticles are identical. In such an embodiment, the offset in the position of the images is equivalent to the offset of the image slits in the exit pupil, multiplied by the reduction ratio of the projection optics. Specifically, reticles 104a and 104b are imaged at exit pupil 134 and the image exposed onto the substrate stage 114. The exposure dose delivered to each reticle image can be independently controlled by adjusting the illumination intensity in each illumination slit.

In one embodiment of the present invention, the images from of at least a portion of each of the dual reticles 104a and 104b are images from different locations of one of the dual reticles 104a and 104b.

As previously described, the calibration detector 140 is used on the substrate stage 114 to receive images from the scanning stage 103. The calibration detector 140 allows for real-time system calibration between the stages 103 and 114.

In one embodiment of the present invention, the substrate stage 114 contains at least one substrate such as a resist-coated wafer or at least one flat-panel display.

In one embodiment of the present invention, the dual reticles comprise an image of an integrated circuit pattern.

In still a further embodiment of the present invention, one of the dual reticles is a phase-shift reticle that is used to phase-shift the image illuminated from that reticle.

Figure 4:
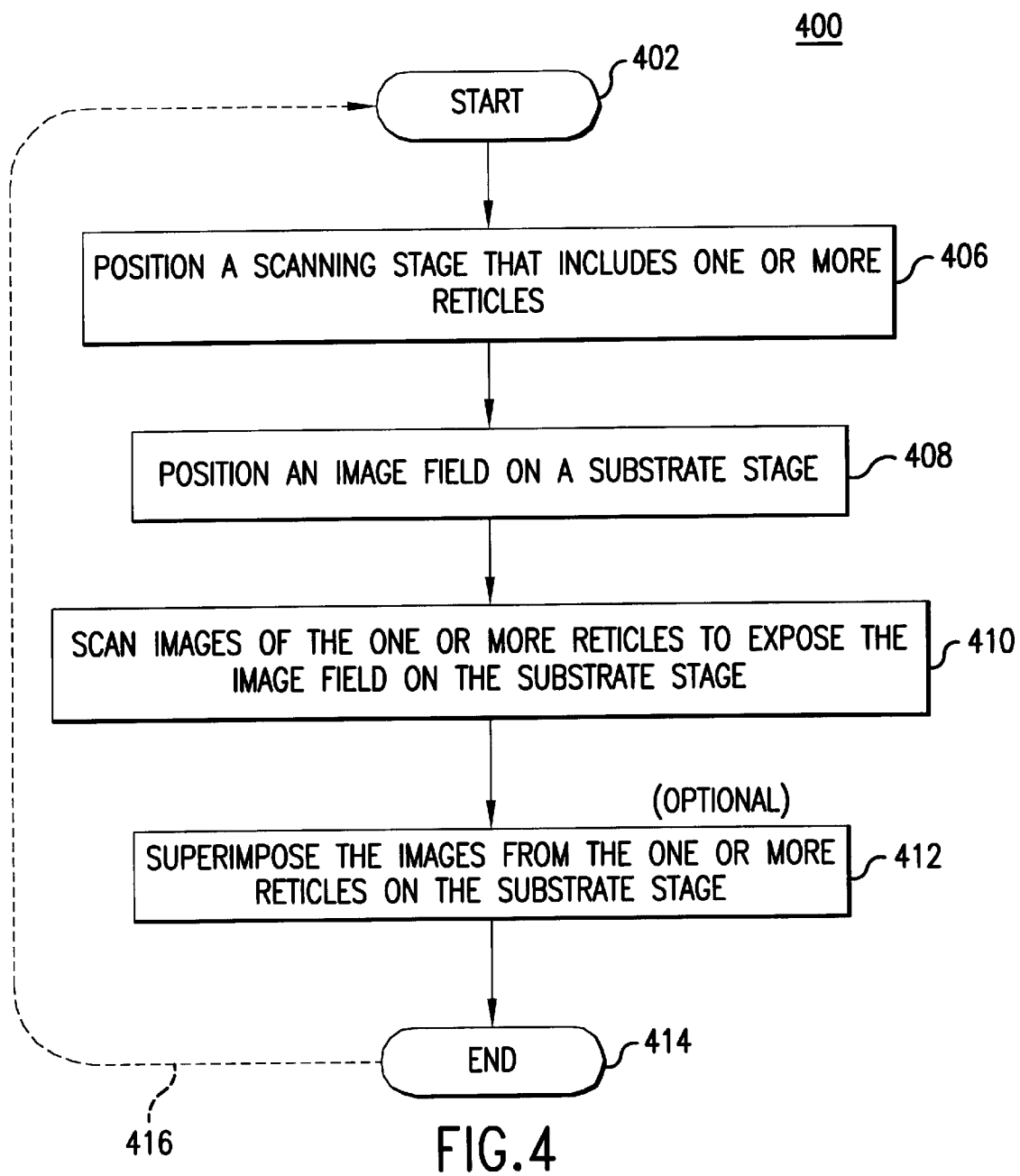
FIG. 4 illustrates a flow diagram of the exposure method, according to one embodiment of the present invention.

FIG. 4 illustrates a flow diagram of the exposure method, according to one embodiment of the present invention. A routine for exposing a field on a substrate stage with images from dual reticles 104a and 104b starts at step 402 and immediately proceeds to step 406.

In step 406, the system 100 positions a scanning stage that includes one or more reticles. The system proceeds to step 408. In an alternative embodiment, after step 406, but prior to step 408, the system 100 conditions the beams incident from the one or more reticles. In an embodiment, the system 100 conditions the beams with pupil filters.

In step 408, the system 100 positions an image field on a substrate stage. The substrate stage includes a substrate such as a wafer. The system proceeds to step 410.

In step 410, the system 100 scans the images of the one or more reticles to expose the image field on the substrate stage. In one embodiment of the present invention, the field is simultaneously exposed with at least two images from dual reticles, respectively. Optionally, the system proceeds to step 412.

In optional step 412, according to one embodiment of the present invention, the system 100 can superimpose the images in the field on the substrate stage. The routine 400 then proceeds to step 414 and terminates (i.e., the routine ends). Alternatively, the routine 400 can be repeated from step 414 to step 402, as depicted by dashed arrow 416.

Figure 5:
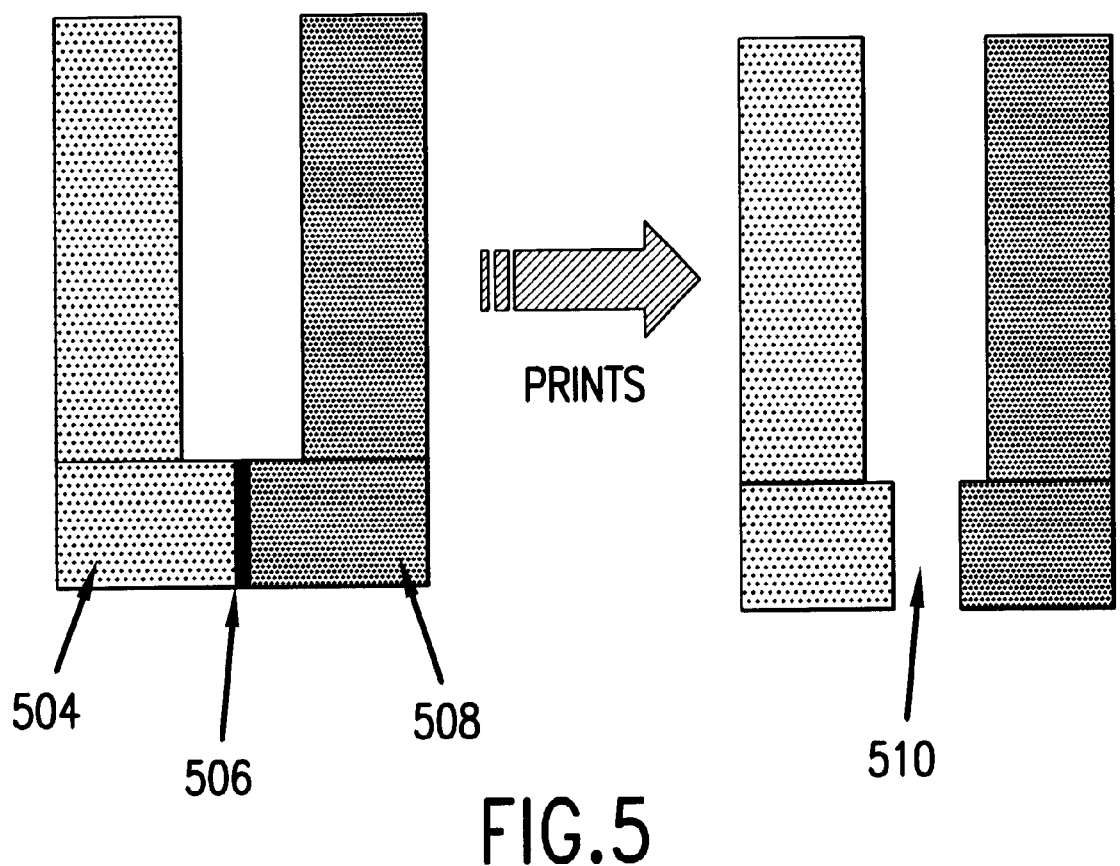
FIG. 5 shows a double exposure technique.

FIG. 5 shows a double exposure technique. Double exposure techniques typically leave gaps, as shown, at the phase boundaries, which can be problematic, as described elsewhere herein. FIG. 5 illustrates this difficulty. In FIG. 5, the phase 0 mask 504 and phase 180 mask 508 leave a phase boundary 506. In printing, this results in a gap 510.

Figure 6:
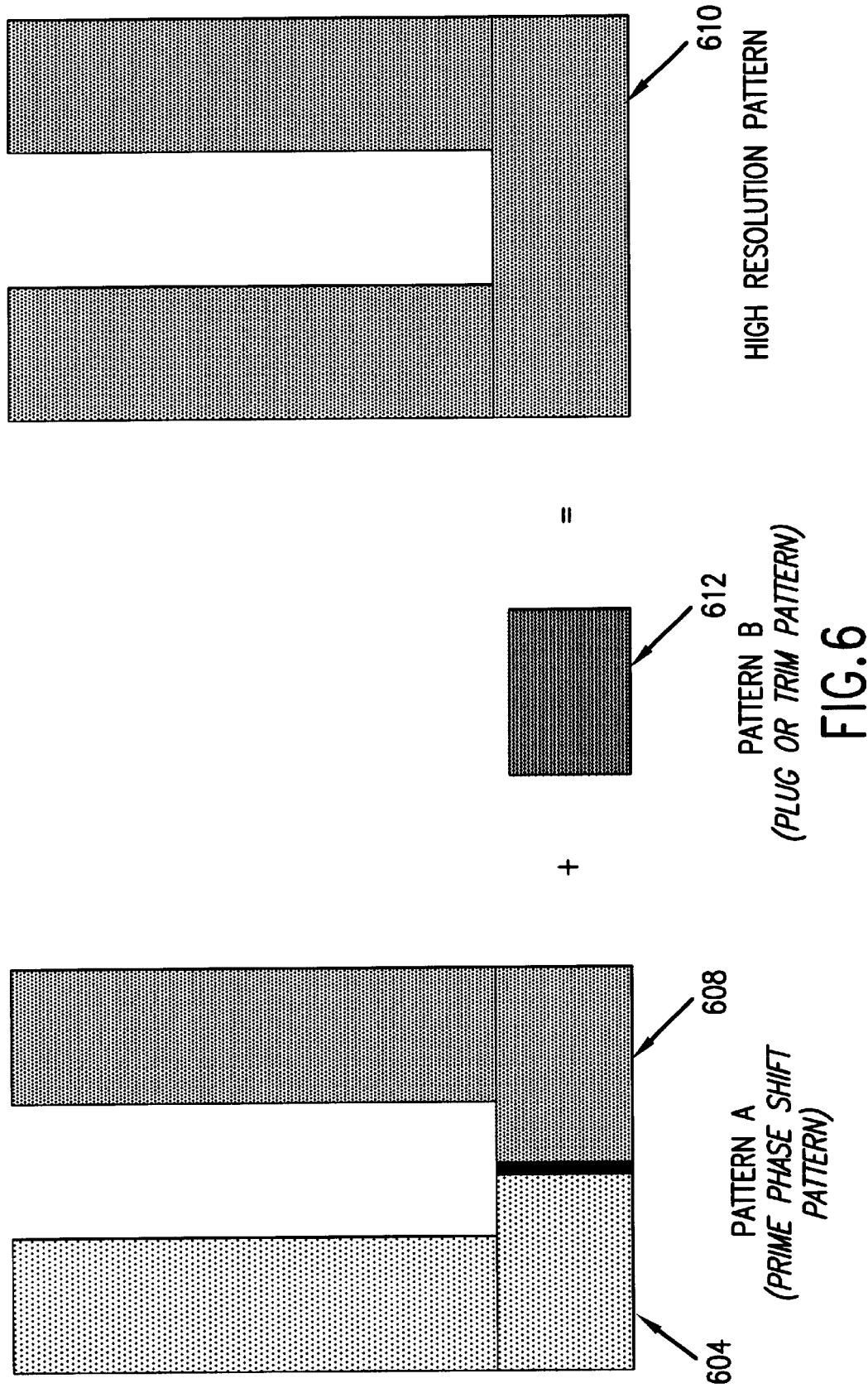
FIG. 6 shows a double exposure technique, according to an embodiment of the present invention.

FIG. 6 shows a double exposure technique according to an embodiment of the present invention where the additional images from one or more reticles (also called a plug/trim mask) provide a better overall pattern. Referring to FIG. 6, pattern A includes phase 0 mask 604 and phase 180 mask 608. The addition of plug or trim pattern 612 provides high resolution pattern 610 that does not suffer from the gap 510.

Figure 7:
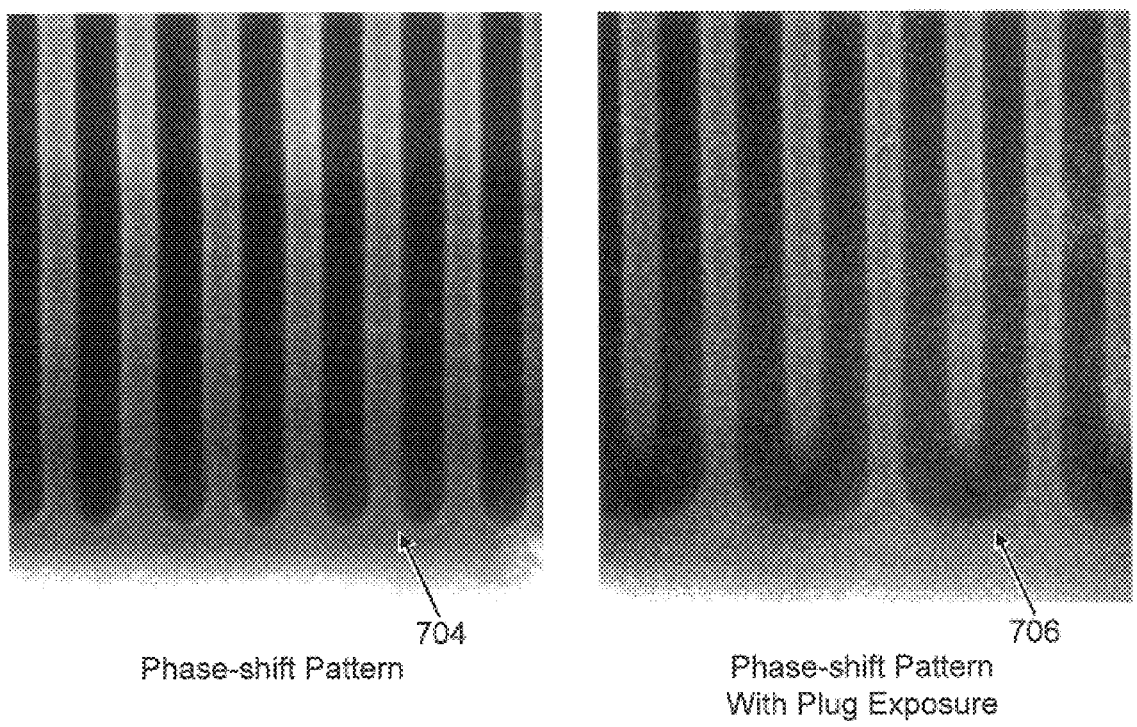
FIG. 7 shows a plug/trim mask/reticle technique using double exposure for U-image printing, according to an embodiment of the present invention.

FIG. 7 shows a plug/trim mask/reticle technique using double exposure for U-image printing. FIG. 7 includes two photographs that show the effect of exposing the additional image(s) with a plug pattern as described in FIG. 6, as indicated in the difference between pattern 704 without a plug and pattern 706 with a trim.

Figure 8:
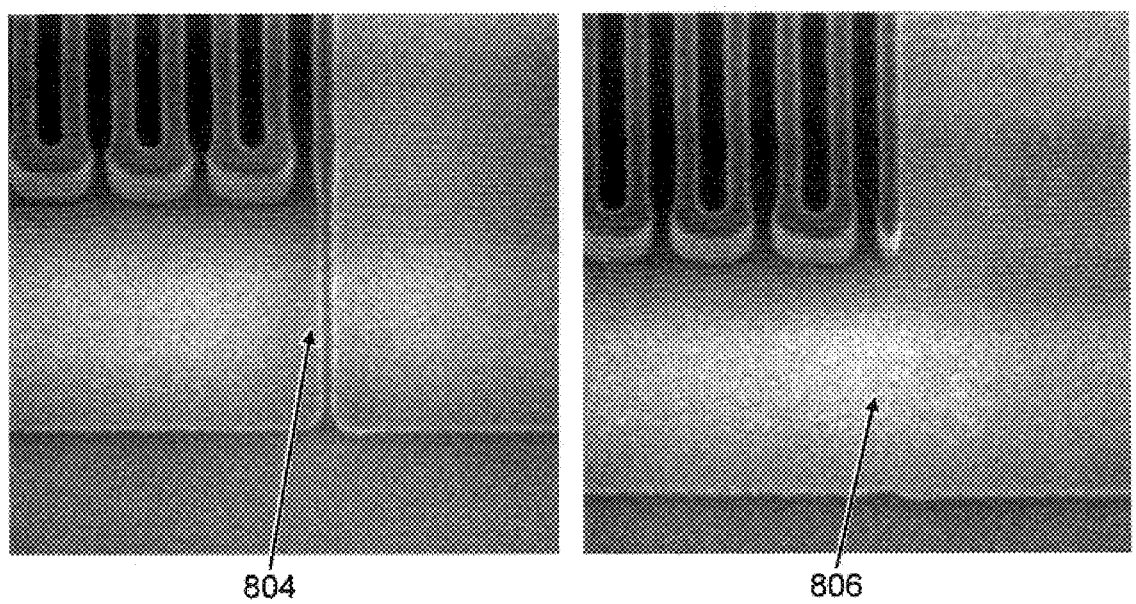
FIG. 8 shows a plug/trim mask second exposure technique for phase edge removal, according to an embodiment of the present invention.

FIG. 8 shows a plug/trim mask second exposure technique for phase edge removal. In FIG. 8, the phase edge is removed by use of a plug pattern as described in FIG. 6. A phase edge 804 is shown without removal and a phase edge 806 is indicated after removal by a plug mask exposure according to an embodiment of the present invention.

Conclusion

While specific embodiments of the present invention have been described above, it should be understood that they have been presented by way of example only, and not limitation. It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A lithographic system, comprising:

a scanning stage that controls one or more reticles, and having a range of motion that permits scanning of at least two patterns formed on said one or more reticles simultaneously;

projection optics positioned relative to said one or more reticles to simultaneously project images corresponding to said at least two patterns; and a substrate stage positioned relative to said projection optics to receive said images corresponding to said at least two patterns simultaneously projected from said projection optics, wherein said scanning stage positions said images corresponding to at least a portion of each of said at least two patterns to simultaneously project each of said images at an image field on said substrate stage such that combining projections of said images is not required prior to exposure at said image field on said substrate stage.

2. A lithographic system of claim 1, wherein said images corresponding to said at least two patterns are images from different locations of one of said one or more reticles.

3. A lithographic system of claim 1, further comprising:

a calibration detector on said substrate stage to receive said images corresponding to said at least two patterns from said scanning stage, wherein real-time system calibration is obtained.

4. A lithographic system of claim 1, wherein said substrate stage contains at least one resist coated wafer.

5. A lithographic system of claim 1, wherein at least one of said images corresponding to said at least two patterns formed on said one or more reticles comprise an image of an integrated circuit pattern.

6. A lithographic system of claim 1, wherein one of said at least two patterns formed on said one or more reticles comprises a phase-shift pattern.

7. A lithographic system of claim 1, wherein said scanning stage includes one or more pupil filters that independently condition said images corresponding to said at least two patterns.

8. A method of exposing a field on a substrate stage with images from at least two patterns, formed on at least one reticle, comprising:

a) positioning a scanning stage that includes the at least one reticle;

b) positioning an image field on a substrate stage, wherein said image field results from projection optics positioned relative to said scanning stage and said substrate stage; and c) scanning images corresponding to said at least two patterns simultaneously from said scanning stage to simultaneously project each of said images at said image field on said substrate stage such that combining projections of said images is not required prior to exposure at said image field on said substrate stage.

9. The method of claim 8, further comprising:

d) superimposing said one or more images in said image field on said substrate stage.

10. The method of claim 8, further comprising:

e) exposing a resist coated wafer positioned on said substrate stage.

11. The method of claim 8, providing said scanning step c) further includes the step of conditioning said images corresponding to said at least two patterns independently.

12. The method of claim 8, providing at least two of the at least two patterns are the same pattern.

13. The method of claim 8, providing at least one of the at least two patterns contains integrated circuit patterns.

14. The method of claim 8, providing one of the at least two patterns is a phase-shift pattern.

* * * * *

UNITED STATES PATENT AND TRADEMARK OFFICE
CERTIFICATE OF CORRECTION

PATENT NO. : 6,611,316 B2  
DATED : August 26, 2003  
INVENTOR(S) : Harry Sewell It is certified that error appears in the above-identified patent and that said Letters Patent is hereby corrected as shown below:

<u>Title page,</u>
Item [73], Assignee, please replace "Wilton CT (US)" with -- Veldhoven, Netherlands (NL) --.

Signed and Sealed this

Thirteenth Day of January, 2004

JON W. DUDAS  
*Acting Director of the United States Patent and Trademark Office*